(12) United States Patent
Theodoras, II

(10) Patent No.: US 6,580,735 B1
(45) Date of Patent: Jun. 17, 2003

(54) ULTRA-LINEAR LASER DRIVE CIRCUIT

(75) Inventor: James T. Theodoras, II, Plano, TX (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/540,294

(22) Filed: Mar. 31, 2000

(51) Int. Cl.⁷ .............................. H01S 3/13; H01S 3/00
(52) U.S. Cl. ................ 372/38.02; 372/38.1; 372/38.07; 372/29.05
(58) Field of Search ...................................... 372/38.02

(56) References Cited

U.S. PATENT DOCUMENTS 4,484,331 A  * 11/1984 Miller ......................... 372/38

OTHER PUBLICATIONS

"N–Channel 30–V (D–S) MOSFET" published by Vishay Siliconix, 2201 Laurelwood Road, Santa Clara, CA, 95054, pp. 3–1 through 3–4, Nov. 23, 1998.
"P–Channel 30–V (D–S) Rated MOSFET" published by Vishay Siliconix, pp. 3–1 through 3–4, Dec. 17, 1996.

* cited by examiner

Primary Examiner—Paul Ip
Assistant Examiner—Armando Rodriguez
(74) Attorney, Agent, or Firm—Gray Cary Ware & Freidenrich, LLP

(57) ABSTRACT

The ultra-linear laser drive circuit of the present invention includes a transconductance operational amplifier circuit integrated with a low-pass filter. The transconductance operational amplifier circuit linearizes the output power of the laser drive circuit. The low-pass filter is a second-order low-pass filter which reduces the noise of the laser drive circuit.

23 Claims, 1 Drawing Sheet

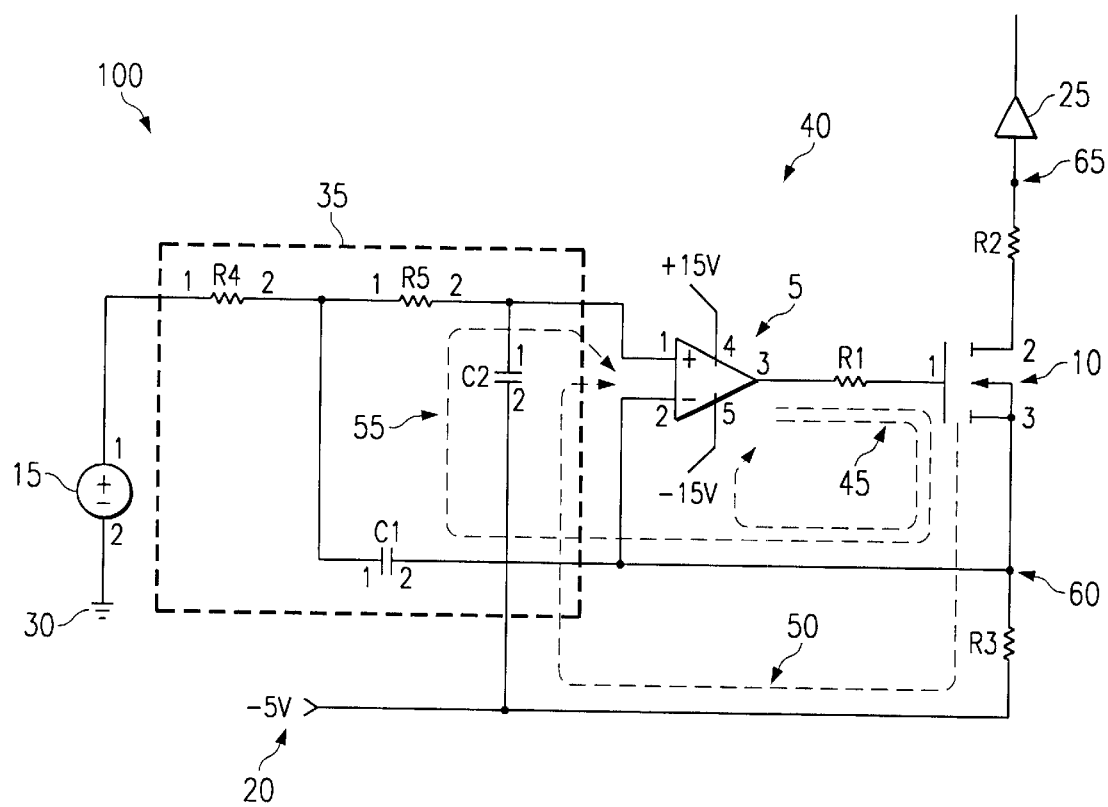

ULTRA-LINEAR LASER DRIVE CIRCUIT

TECHNICAL FIELD OF THE INVENTION

The present invention relates generally to fiber optic communications systems. In particular, this invention relates to laser drive circuits within fiber optic communications systems, and more particularly to a system and method of linearizing the output power of a laser drive circuit.

BACKGROUND OF THE INVENTION

In fiber-optic communications systems, multiple channels of optical data, all at different colors of the spectrum, are transmitted from a laser diode over a single fiber and input into an amplifier. The amplifiers then amplify the optical data received and retransmit the optical data. However, problems arise when there are power fluctuations on the optical data channels input into the amplifiers. If the aggregate power input into the amplifier is not linear or held at a constant level, the slope of the amplifier's gain may change and/or the amplifier noise may increase causing optical data to be lost.

A first method for linearizing the output power of a laser diode is to use a rear-beam detector (RBD) packaged in with a laser. The output from the RBD is input into a control loop with what ever is driving the laser. The control loop then linearizes the output power from the laser diode.

The problem with this first method is that it is very difficult to design a laser diode packaged in with a RBD. The process is very labor intensive and it is difficult to control the RBD value. Three different vendors may manufacture three different laser diodes packaged with RBDs containing RBD values which significantly differ from the other. RBDs from different vendors may be used if the power output from the laser diode fluctuates over a narrow dynamic range. However, RBDs from different vendors will not work if the laser diode output power fluctuates over a wide range. To work over a wide range, the manufacturers would have to ensure that all the RBD values are the same. This would double or triple the cost of the packaged laser diodes and RBDs.

A second method of keeping the power level of the optical data channels constant is to monitor the aggregate power input into the amplifier and to dedicate various channels on the fiber to control the aggregate power level. This may be done by setting up a first order linear control loop using a MOSFET as a constant current source and modulating its bias so that the current to the diode may be raised or lowered. As the current is raised or lowered, so is the power of the dedicated channel to ensure that the aggregate power of the optical data channels remains constant.

One problem with this second method is that the power changes on these dedicated optical data channels may fluctuate very rapidly. The power circuits located on each optical data channel may not be able to compensate for the fast power fluctuations since they work over a very narrow dynamic range. Furthermore, if all the data channels are simultaneously flipped on or off, the power circuits on each data channel cannot compensate for the huge power surge or power loss. The end result is that the power output from the laser and input into the amplifier is non-linear, thus optical data may be dropped.

Another problem with this second method occurs if an optical data receiver cannot determine what color light it is receiving. To determine what color of light the optical data receiver is receiving, a tone at a specified frequency must be passed along with the optical data to each optical data receiver. However, the first order control loop cannot simultaneously pass a tone and keep the aggregate power level constant, so it drops the tone.

SUMMARY OF THE INVENTION

The present invention provides an ultra-linear laser drive circuit that substantially eliminates or reduces disadvantages and problems associated with previously developed systems and methods used for linearizing laser drive circuits.

More specifically, the present invention provides a system for linearizing and reducing the noise from the output of the laser drive circuit. The ultra-linear laser drive circuit of the present invention includes a transconductance operational amplifier circuit integrated with a low-pass filter. The transconductance operational amplifier circuit linearizes the output power of the laser drive circuit. The low-pass filter is a second-order low-pass filter which reduces the noise of the laser drive circuit.

The present invention provides an important technical advantage by providing a system and method for linearizing the output power of the laser drive circuit.

The present invention provides another technical advantage by providing a system and method for reducing the noise from the output power of the laser drive circuit by 30 to 60 dB.

The present invention provides yet another technical advantage by providing an ultra-linear laser drive circuit which does not require a rear-beam detector.

The present invention provides yet another technical advantage by providing an ultra-linear laser drive circuit which is capable of passing a tone.

The present invention provides yet another technical advantage by providing an ultra-linear laser drive circuit which reduces ground bounce.

The present invention provides yet another technical advantage by providing an ultra-linear laser drive circuit which yields an output power which is constant across many different laser diode types and brands.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIG. 1 shows an embodiment of the ultra-linear laser drive circuit of the present invention comprising a transconductance operational amplifier circuit integrated with a second-order low-pass filter.

DETAILED DESCRIPTION OF THE INVENTION

Preferred embodiments of the present invention are illustrated in the FIGURES, like numerals being used to refer to like and corresponding parts of the various drawings.

The ultra-linear laser drive circuit of the present invention uses a transconductance operational amplifier circuit integrated with a low-pass filter to linearize and reduce the noise of the laser drive circuit's output power. The embodiment for the ultra-linear laser drive circuit 100 depicted in FIG. 1 shows a low-pass filter circuit 35 integrated with a transconductance operational amplifier circuit 40. The transconductance operational amplifier circuit 40 comprises a MOSFET 10, a transconductance operational amplifier 5, a laser diode 25, a negative voltage source 20, a first resistor R1, a second resistor R2, and a third resistor R3. The low-pass filter circuit comprises a fourth resistor R4, a fifth resistor R5, an input voltage source 15, a first capacitor C1, and a second capacitor C2. The MOSFET 10 has a gate 1, a source 2 and a drain 3. The operational transconductance amplifier 5 has an inverting input 1, a non-inverting input 2, a current output 3, a positive voltage supply 4, and a negative voltage supply 5. A bi-polar transistor comprised of a base, collector and emitter may be used. in place of MOSFET 10. Furthermore, the bi-polar transistor or MOSFET 10 may be N-channel or P-channel. Examples. of component values for the ultra-linear laser drive circuit are as follows: R1=R2=10 ohms, R3=20 ohms, R4=R5=22.5 K ohms, C1=C2=1 nF, the negative voltage source 20=−5 Volts, and the positive and negative voltage supply of the transconductance operational amplifier 5=+15 Volts and −15 Volts respectively.

In FIG. 1, the first resistor R1 electrically connects the current output 3 of the transconductance operational amplifier 5 to the gate 1 of the MOSFET 10, the second resistor R2 electrically connects the drain 2 of the MOSFET 10 to the laser diode 25, and the third resistor R3 electrically connects the source 3 of the MOSFET 10 to the negative voltage source 20. Finally, the inverting input 2 of the transconductance operational amplifier 5 is electrically connected to the source 3 of the MOSFET 10.

The low-pass filter circuit 35 is electrically integrated into the transconductance operational amplifier circuit 40 by first electrically connecting the first plate 1 of the first capacitor C1 to side 2 of resistor R4 and side 1 of resistor R5. Next, plate 2 of capacitor C1 is electrically connected to the inverting input 2 of the transconductance operational amplifier 5. Plate 1 of capacitor C2 is then electrically connected to side 2 of resistor R5 and the non-inverting input 1 of the operational transconductance amplifier 5. Plate 2 of the capacitor C2 is electrically connected to the negative voltage source 20. Finally, the positive terminal 1 of the input voltage source 15 is electrically connected to side 1 of resistor R4 and the negative terminal 2 of the input voltage source 15 is electrically connected to ground 30.

One advantage that the ultra-linear laser drive circuit 100 provides is that it linearizes the output power of the laser diode 25 over a wide dynamic range. For example, the output power of laser diode 25 of the ultra-linear laser drive circuit 100 can be held linear for a range of −30 dBm to +5 dBm. The actual range achievable depends upon the quality of amplifier 5 used in the implementation. To achieve linearity of the output power of the ultra-linear laser drive circuit 100, the non-inverting input 1 and the inverting input 2 of the transconductance operational amplifier 5 must be kept at the same voltage. For example, if 1 Volt is input into the non-inverting input 1 of the transconductance operational amplifier 5, the inverting input 2 of the transconductance operational amplifier 5 must also be 1 Volt to achieve linearity. The transconductance operational amplifier 5 will do what ever is necessary to make sure the inverting input 2 will also be at 1 Volt. As shown in FIG. 1, the resistor R3, also known at the source resistor, is electrically connected to the inverting input 2 of the transconductance operational amplifier 5 through feedback loop 45. In order for the inverting input 2 of the transconductance operational amplifier 5 to be at 1 Volt, node 60 must also be at 1 Volt. If, for example, the resistor R3 is 20 ohms, the transconductance operational amplifier 5 will output the appropriate current so that when it flows across the 20 ohm resistor R3, node 60 will be at 1 Volt. If node 60 is at 1 Volt, then the voltage fedback through feedback loop 45 will also be 1 Volt. Thus, the inverting input 2 of the transconductance operational amplifier 5 will be at one 1 Volt and set the linearity of the ultra-linear laser drive circuit 100.

Another advantage of the ultra-linear laser drive circuit 100 is that it reduces the noise generated by the output power of the laser diode 25 by 30 to 60 dB. The ultra-linear laser drive circuit 100 also significantly reduces noise due to ground bounce by an amount equal to the attenuation of the two-pole low pass filter, typically 30 to 60 dB. The second-order, two-pole low-pass filter circuit 35 integrated with the transconductance operational amplifier circuit 40 forms two feedback paths 50 and 55. The two poles of the low-pass filter circuit 35 may be symmetrical. Feedback paths 50 and 55 cancel out any noise produced by the ultra-linear laser circuit 100 due to a change in frequency of the input voltage source 15. As the frequency of the input voltage source 15 increases, the impedance of capacitors C1 and C2 lowers until capacitors C1 and C2 eventually become shorts. When C1 shorts out, feedback path 50 mainly cancels out any noise due to the negative voltage source 20. When C2 shorts out, feedback path 55 mainly cancels out any noise due to the inverting input 2 of the transconductance operational amplifier 5.

Yet another advantage of the ultra-linear laser drive circuit 100 is that any tone above 20 KHz may be injected onto an optical data channel of the ultra-linear laser drivecircuit 100 at node 65 without interfering with feedback loop 45. If a tone is injected onto other circuits, the voltage or tone will start swinging up and down and the output power of the circuit will become non-linear. If a tone is injected at node 65 of the ultra-linear laser drive circuit 100 of the present invention, the voltage at node 65 will begin to swing up and down, however, the high impedance of MOSFET 10 will prevent feedback loop 45 or the remainder of the circuit 100 from being disturbed. The high impedance of the MOSFET 10 is due to the gain of the transconductance operational amplifier 5. Thus, the laser current through the laser diode 25 can be modulated and the ultra-linear laser drive circuit 100 can pass a tone without affecting the remainder of the circuit 100.

Yet another advantage of the ultra-linear laser drive circuit 100 is that resistor R3 may be used to set the maximum current of the ultra-linear laser drive circuit 100 so that it never rises above the maximum allowable current for laser diode 25. The clamping of the laser driver current prevents the laser diode 25 from being damaged. For example, if resistor R3 is set to 20 ohms, the laser diode current will never go over 100 milliamps since the maximum voltage is 5 Volts. This feature eliminates the need for an overcurrent loop which requires numerous components.

Yet another advantage of the ultra-linear laser drive circuit 100 is that a tone may be injected on a signal at the base resistor R1 without the need for any oscillators, drivers, or any other components by simply raising the value of resistor R1. For example, raising the resistor value of R1 from 10 ohms to 10 K ohms causes the loop 45 to become unstable and ring, however, it does not prevent the ultra-linear laser drive circuit 100 from maintaining linearization of the output power of the laser diode 25. This feature allows a tone to be produced out of a signal at resistor R3 without additional components, such as an oscillator or driver, which are normally required.

Finally, the ultra-linear laser drive circuit 100 does not require a rear-beam detector (RBD) to linearize the output power of the laser diode 25. Instead, the ultra-linear laser drive circuit 100 uses the transconductance operational amplifier circuit 40 integrated with a low-pass filter circuit 35 to linearize the output power of the laser diode 25. Since the RBD is not used to linearize the ultra-linear laser drive circuit 100, it may be used for another purpose. As stated above, the ultra-linear laser drive circuit 100 is capable of carrying a tone on an optical data channel as well as carry optical data. However, the tone must be very low and at a very precise frequency or the optical data may be lost. Since the tone must be very low, synchronous detection must be used to guarantee that the tone can be read or passed. In the present invention, the RBD is used to provide power to a synchronous loop which reads or passes the tone carried on the optical data channel. Since the RBD is not utilized to linearize the output power of the laser diode 25, the output power of the ultra-linear laser drive circuit 100 can be held constant over many different types of laser diode types and brands.

In summary, the ultra-linear laser drive circuit of the present invention comprises a transconductance operational amplifier circuit integrated with a low-pass filter. The transconductance operational amplifier circuit linearizes the output power of the laser drive circuit. The low-pass filter is a second-order low-pass filter which reduces the noise of the laser drive circuit.

The present invention provides several important technical advantages. The ultra-linear laser drive circuit linearizes the output power, reduces the noise from the output power of the laser drive circuit by 30 to 60 dB, eliminates the need for a rear-beam detector, is capable of passing a tone, and yields an output power which is constant across many different laser diode types and brands.

Although the present invention has been described in detail, it should be understood that various changes, substitutions and alterations can be made hereto without departing from the spirit and scope of the invention as described by the appended claims.

What is claimed is:

1. A system for linearizing the output of a laser drive circuit, comprising:
    a transconductance operational amplifier circuit operable to linearize the output power of said laser drive circuit said transconductance operational amplifier circuit further comprising:
        a MOSFET, said MOSFET having a source, a drain, and a gate;
        a transconductance operational amplifier, said transconductance operational amplifier having a non-inverting input, an inverting input, a positive voltage supply, a negative voltage supply, and a current output, said inverting input connected to said source of said MOSFET;
        a laser diode;
        a negative voltage source;
        a first resistor connecting said current output of said transconductance operational amplifier to said gate of said MOSFET;
        a second resistor connecting said drain of said MOSFET to said laser diode;
        a third resistor connecting said source of said MOSFET to said negative voltage source; and
        a low-pass filter integrated with said transconductance operational amplifier circuit operable to reduce the noise of said laser drive circuit.

2. The system for linearizing said laser drive circuit of claim 1, wherein said low-pass filter integrated with said transconductance operational amplifier circuit comprises:
    a fourth resistor;
    a fifth resistor;
    an input voltage source operable to provide an input voltage to said low-pass filter, said input voltage source having a negative terminal connected to ground and a positive terminal connected to a first side of said fourth resistor;
    a first capacitor wherein a first plate of said first capacitor is connected to said inverting input of said transconductance operational amplifier circuit and a second plate of said first capacitor is connected to a second side of said fourth resistor and a first side of said fifth resistor; and
    a second capacitor wherein a first plate of said second capacitor is connected to a second side of said fifth resistor and said non-inverting input of said transconductance operational amplifier; further wherein a second plate of said second capacitor is connected to said negative voltage source.

3. The system for linearizing said laser drive circuit of claim 1, wherein said laser drive circuit is operable to pass any tone above 20 kilohertz on an optical data channel.

4. A system for linearizing the output of a laser drive circuit, comprising:
    a transconductance operational amplifier circuit operable to linearize the output power of said laser drive circuit said transconductance operational amplifier circuit further comprising:
        a bipolar transistor, said bipolar transistor having a base, an emitter, and a collector;
        a transconductance operational amplifier, said transconductance operational amplifier having a non-inverting input, an inverting input, a positive voltage supply, a negative voltage supply, and a current output, said inverting input connected to said collector of said bipolar transistor;
        a laser diode;
        a negative voltage source;
        a first resistor connecting said current output of said transconductance operational amplifier to said base of said bipoloar transistor;

a second resistor connecting said emitter of said bipolar to said laser diode;

a third resistor connecting said collector of said bipolar transistor to said negative voltage source; and a low-pass filter integrated with said transconductance operational amplifier circuit operable to reduce the noise of said laser drive circuit.

5. The system for linearizing said laser drive circuit of claim 2, wherein said:low-pass filter is a second-order low-pass filter.

6. The system for linearizing said laser drive circuit of claim 4, wherein said bipolar transistor may either be N-channel or P-channel.

7. The system for linearizing said laser drive circuit of claim 5, wherein said second-order low-pass contains two poles which may be symmetrical.

8. The system for linearizing said laser drive circuit of claim 1, wherein said laser drive circuit is linear over a dynamic range of −30 dBm to +5 dBm.

9. The system for linearizing said laser drive circuit of claim 1, wherein said laser drive circuit's output drive characteristics are constant over a plurality of different types and brands of said laser diode.

10. The system for linearizing said laser drive circuit of claim 1, wherein said laser drive circuit reduces ground bounce by 30–60 dB.

11. A system for linearizing the output of a laser drive circuit, comprising:

a transconductance operational amplifier circuit operable to linearize the output power of said laser drive circuit, said transconductance operational amplifier comprising:

a MOSFET, said MOSFET having a source, a drain, and a gate;

a transconductance operational amplifier, said transconductance operational amplifier having a non-inverting input, an inverting input, a positive voltage supply, a negative voltage supply, and a current output, said inverting input connected to said source of said MOSFET;

a laser diode;

a negative voltage source;

a first resistor connecting said current output of said transconductance operational amplifier to said gate of said MOSFET;

a second resistor connecting said drain of said MOSFET to said laser diode; and a third resistor connecting said source of said MOSFET to said negative voltage source; and a low-pass filter integrated with said transconductance operational amplifier circuit operable to reduce the noise of said laser drive circuit, said low-pass filter comprising:

a fourth resistor;

a fifth resistor;

an input voltage source operable to provide an input voltage to said low-pass filter, said input voltage source having a negative terminal connected to ground and a positive terminal connected to a first side of said fourth resistor;

a first capacitor wherein a first plate of said first capacitor is connected to said inverting input of said transconductance operational amplifier circuit and a second plate of said first capacitor is connected to a second side of said fourth resistor and a first side of said fifth resistor; and a second capacitor wherein a first plate of said second capacitor is connected to a second side of said fifth resistor and said non-inverting input of said transconductance amplifier; further wherein a second plate of said second capacitor is connected to said negative voltage source.

12. A method for linearizing the output of a laser drive circuit comprising the steps of:

integrating a transconductance operational amplifier circuit with a low-pass filter circuit comprising the steps of:

connecting a current output of a transconductance operational amplifier to a gate of a MOSFET using a first resistor;

connecting a drain of said MOSFET to a laser diode using a second resistor;

connecting a source of said MOSFET to a first side of a third resistor, said first side of said third resistor also connected to an inverting input of said transconductance operational amplifier;

connecting a negative voltage source to a second side of said third resistor;

connecting a negative terminal of an input voltage source to ground;

connecting a positive terminal of said input voltage source toga first side of a fourth resistor;

connecting a first plate of a first capacitor to said inverting input of said transconductance operational amplifier;

connecting a second plate of said first capacitor to a second side of said fourth resistor and a first side of a fifth resistor;

connecting a first plate of a second capacitor to a second side ofGlsaid fifth resistor and a non-inverting input of said transconductance operational amplifier; and connecting a second side of said second capacitor to said negative voltage source.

13. The method for linearizing the output of said laser drive circuit of claim 12, further comprising the steps of:

injecting a tone on said laser drive circuit;

passing said tone on an optical data channel;

using synchronous detection to read said tone via a synchronous loop; and using a rear-beam detector to provide power to said synchronous loop.

14. The method for linearizing the output of said laser drive circuit of claim 13, wherein said rear-beam detector is not used to linearize said laser drive circuit.

15. A method for linearizing the output of a laser drive circuit comprising the steps of:

integrating a transconductance operational amplifier circuit with a low-pass filter circuit comprising the steps of:

connecting a current output of a transconductance operational amplifier to a base of a bipolar transistor using a first resistor;

connecting an emitter of said bipolar transistor to a laser diode using a second resistor;

connecting a collector of said bipolar transistor to a first side of a third resistor, said first side of said third resistor also connected to an inverting input of said transconductance operational amplifier;

connecting a negative voltage source to a second side of said third resistor;

connecting a negative terminal of an input voltage source to ground;

connecting a positive terminal of said input voltage source to a first side of a fourth resistor;

connecting a first plate of a first capacitor to said inverting input of said transconductance operational amplifier;

connecting a second plate of said first capacitor to a second side of said fourth resistor and a first side of a fifth resistor;

connecting a first plate of a second capacitor to a second side of said fifth resistor and a non-inverting input of said transconductance operational amplifier; and connecting a second side of said second capacitor to said negative voltage source.

16. The method for linerizing the output of said laser drive circuit of claim 12, wherein said low-pass filter is a second-order low-pass filter.

17. A method for linearizing the output of said laser drive circuit of claim 15, wherein said bipolar transistor may either be N-channel or P-channel.

18. The method for linearizing the output of said laser drive circuit of claim 12, wherein said second-order low-pass filter contains two poles which may be symmetrical.

19. The method for linearizing the output of said laser drive circuit of claim 12, wherein said laser drive circuit is linear over a dynamic range of −30 dBm to +5 dBm.

20. The method for linearizing the output of said laser drive circuit of claim 12, wherein said laser drive circuit's output drive characteristics are constant over a plurality of different types and brands of said laser diode.

21. The method for linearizing the output of said laser drive circuit of claim 12, wherein said laser drive circuit reduces ground bounce by 30–60 dB.

22. The system for linearizing said laser drive circuit of claim 1, wherein said MOSFET may either be N-channel or P-channel.

23. A method for linearizing the output of said laser drive circuit of claim 12, wherein said MOSFET may either be N-channel or P-channel.

* * * * *